United States Patent
Lee et al.

(10) Patent No.: US 7,110,259 B2
(45) Date of Patent: Sep. 19, 2006

(54) HEAT DISSIPATING DEVICE INCORPORATING HEAT PIPE

(75) Inventors: Hsieh Kun Lee, Tu-chen (TW); Cheng-Tien Lai, Tu-Chen (TW); Zhi-Bin Tan, Shenzhen (CN)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 169 days.

(21) Appl. No.: 10/946,664

(22) Filed: Sep. 21, 2004

(65) Prior Publication Data

US 2005/0141198 A1 Jun. 30, 2005

(30) Foreign Application Priority Data

Dec. 26, 2003 (TW) .............................. 92222760 U

(51) Int. Cl.
*H05K 7/20* (2006.01)

(52) U.S. Cl. .................. 361/700; 361/699; 257/715; 174/15.2; 165/104.33

(58) Field of Classification Search ................ 361/700; 257/715; 174/15.2; 165/104.26, 80.4
See application file for complete search history.

(56) References Cited

U.S. PATENT DOCUMENTS

| | | | |
|---|---|---|---|
| 5,699,853 A | 12/1997 | Goth et al. | |
| 6,189,601 B1 * | 2/2001 | Goodman et al. | 165/80.3 |
| 6,469,894 B1 * | 10/2002 | Ubukata | 361/700 |
| 6,542,364 B1 * | 4/2003 | Lai et al. | 361/697 |
| 6,915,844 B1 * | 7/2005 | Chou | 165/104.33 |
| 2003/0019610 A1 * | 1/2003 | Liu | 165/80.3 |
| 2005/0103476 A1 * | 5/2005 | Chen et al. | 165/104.33 |
| 2005/0145369 A1 * | 7/2005 | Huang et al. | 165/104.11 |

FOREIGN PATENT DOCUMENTS

| | | |
|---|---|---|
| CN | 1417660 A | 5/2003 |
| TW | 547002 | 8/2003 |
| TW | 547914 | 8/2003 |

* cited by examiner

*Primary Examiner*—Boris Chèrvinsky
(74) *Attorney, Agent, or Firm*—Wei Te Chung

(57) ABSTRACT

A heat dissipating device incorporating heat pipes includes a heat sink (10), a first heat pipe (50) and a second heat pipe (70). The heat sink has a first base (11), a second base (21) and a plurality of fins sandwiched between the first and second bases. Each of the heat pipes has a heat-absorption end (51, 71) and a heat-dissipation end (52, 72). The heat-absorption ends of the first and second heat pipes contact the first base of the heat sink. The heat-dissipation end of the first heat pipe is inserted in the substantial middle portion of the fins, and the heat-dissipation end of the second heat pipe is inserted between the second base and the fins.

19 Claims, 5 Drawing Sheets

HEAT DISSIPATING DEVICE INCORPORATING HEAT PIPE

BACKGROUND OF THE INVENTION

1. Field of the Invention

The present invention relates to a heat dissipating device, and more particularly to a heat dissipating device incorporating heat pipes to improve heat dissipation efficiency of a heat sink thereof.

2. Description of Related Art

Computer electronic devices such as central processing units (CPUs) are the core administrator of electrical signals in most contemporary personal computers. Continued development of CPUs has enabled them to perform more and more functions. Heat generated by CPUs has increased commensurately. Such heat can adversely affect the operational stability of computers. Measures must be taken to efficiently remove the heat from the CPUs. Typically, a heat sink is mounted on a CPU to remove heat therefrom.

Conventionally, a heat sink is made of high thermal conductivity metal materials and generally includes a base and a plurality of fins extending therefrom. The base contacts with an electronic device to absorb heat generated by the electronic device and conducts the heat to the fins, and further such heat is emitted to atmosphere. In order to improve heat-dissipating efficiency, a fan is often attached to a top of the fins to provide forced airflow. However, because of the resistance of the metal materials, a majority of the heat accumulates in the vicinity of the base of the heat sink and only a minority portion of that is conducted to the top of the fins. Thus, the heat sink has a disadvantage that the heat cannot be quickly transferred to the top of the heat sink, thereby reducing heat dissipation efficiency of the heat sink.

Currently, heat dissipating devices using heat pipes are broadly used, as the heat pipe possesses an extraordinary heat transfer capacity with almost no heat loss and can quickly transfer heat from one point to another. A heat pipe consists of a sealed aluminum or copper container with the internal walls lined with a capillary wick structure that is saturated with a working fluid. The most common types of wicks that are used are sintered powder, grooved tube and screen mesh. As the heat pipe absorbs heat at one end thereof, fluid is vaporized, and a pressure gradient is formed in the pipe. This pressure gradient forces the vapor to flow along the pipe from the one end to the other end where the vapor condenses and gives out its latent heat of vaporization. The working fluid is then returned back to the one end of the pipe via the capillary forces developed in the wick structure.

One kind of heat dissipating device using heat pipe has been devised to overcome the above-described disadvantage. As shown in Taiwan Patent Application No. 091212183, the heat dissipating device comprises two heat pipes and two heat sinks. Each heat sink has a base and a plurality fins from the base. The heat pipes are U-shaped. The two heat sinks are placed face to face, and are secured together via the heat pipes inserting into the bases of the two heat sinks. Thus, the heat can be dissipated more efficiently as the heat can be quickly transferred to the top of the heat sink via the heat pipes. Unfortunately, the heat cannot be quickly transferred to the top of the fins of each heat sink which will partially reduce the heat-dissipating efficiency of each heat sink. Thus, this kind of heat dissipating device needs to be improved.

SUMMARY OF THE INVENTION

Accordingly, an object of the present invention is to provide a heat dissipating device incorporating heat pipes which can distribute heat quickly and evenly throughout a heat sink thereof.

In order to achieve the object set out above, a heat dissipating device in accordance with the present invention comprises a heat sink, a first heat pipe and a second heat pipe. The heat sink comprises a first base, a second base and a plurality of fins extending between the first and second bases. Each of the heat pipes has a heat-absorption end and a heat-dissipation end. The heat-absorption end of each of the heat pipes contacts the first base of the heat sink, and the heat-dissipation end of the first heat pipe is inserted in a substantial middle portion of the heat sink and the heat-dissipation end of the second heat pipe is inserted in a top portion of the heat sink. Thus the heat can be distributed quickly and evenly throughout the heat sink.

In one preferred embodiment, the fins of the heat sink comprise first and second fin units with one stacked on the other. A block is arranged between the first and second fin units and the heat-dissipation end of the first heat pipe contacts the block.

In an alternative preferred embodiment, the fins of the heat sink consist of a fin unit, and the heat-dissipation end of the first heat pipe is inserted in a middle of the fins.

Other objects, advantages and novel features of the present invention will become more apparent from the following detailed description when taken in conjunction with the accompanying drawings, in which:

DETAILED DESCRIPTION OF THE INVENTION

Figure 1:
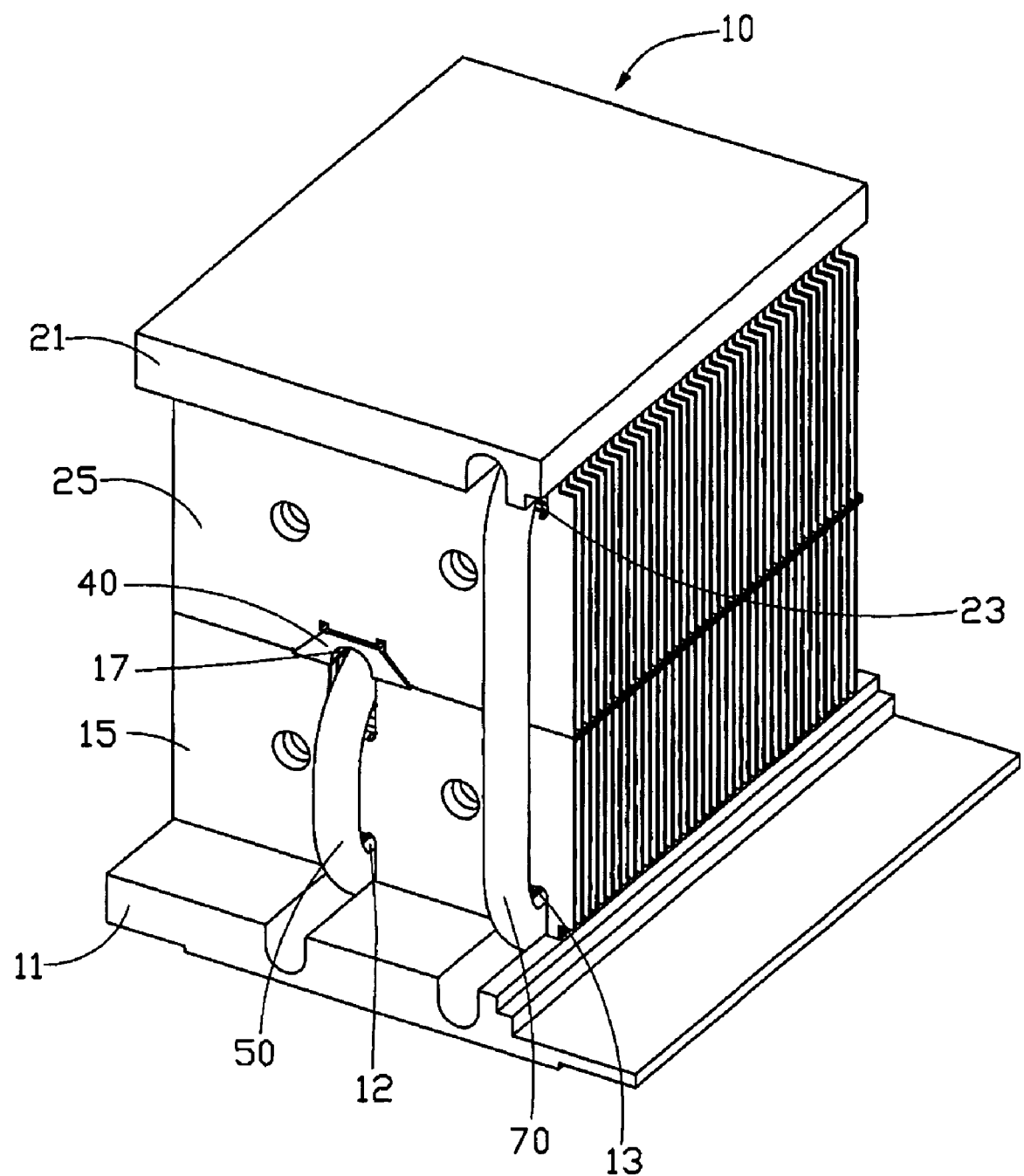
FIG. 1 is an assembled view of a heat dissipating device in accordance with the preferred embodiment of the present invention.
Figure 2:
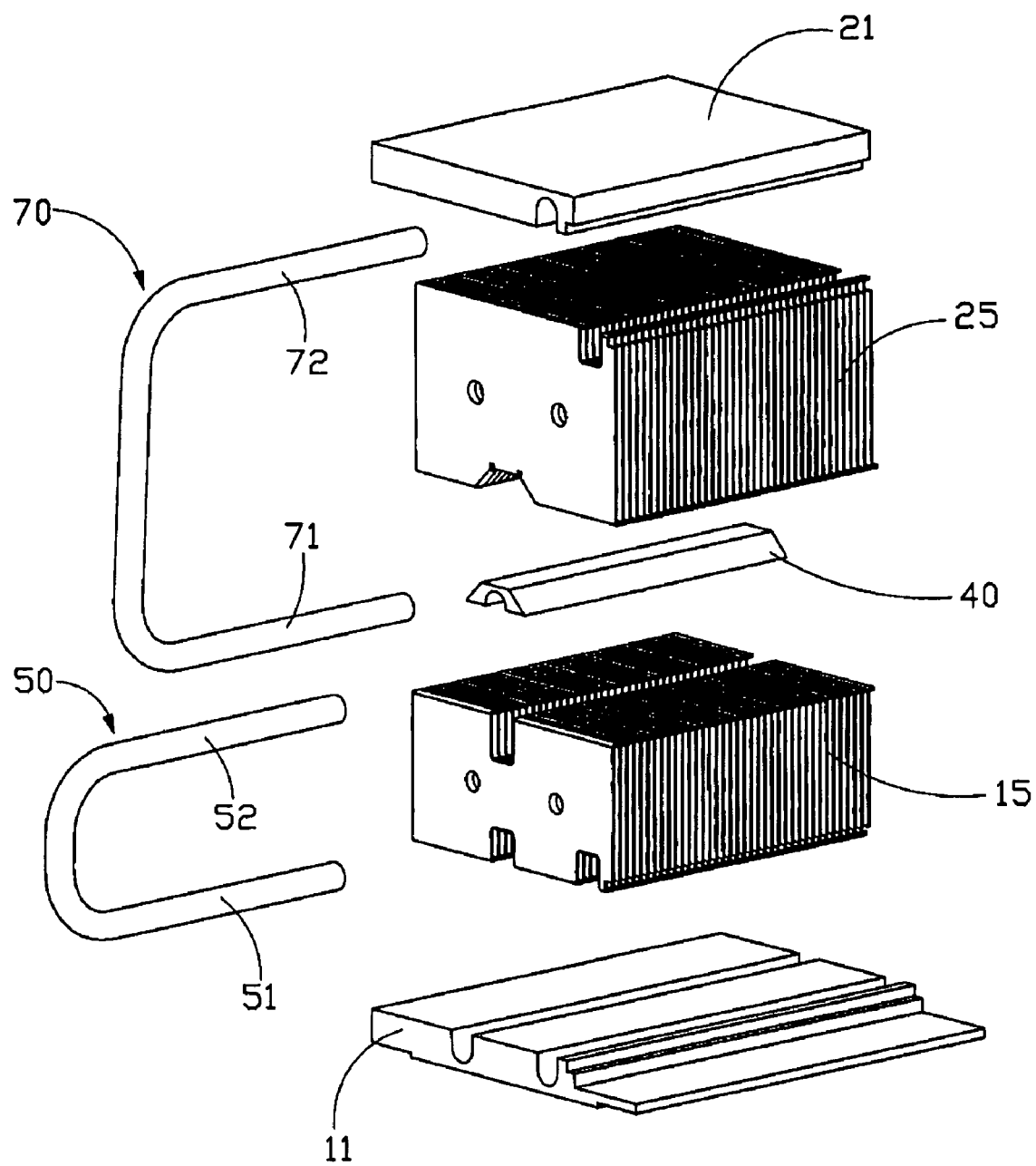
FIG. 2 is an exploded, isometric view of FIG. 1.
Figure 3:
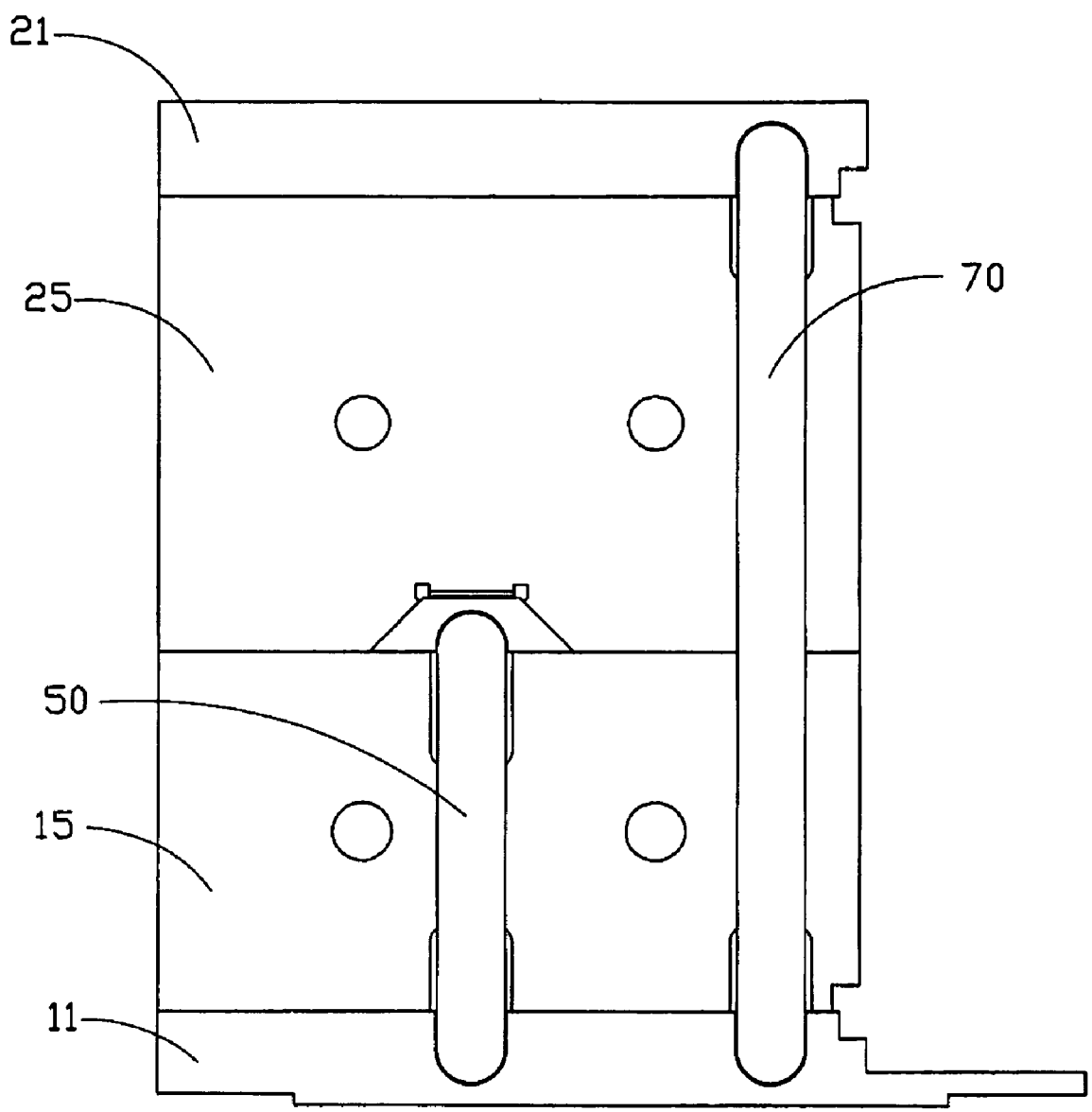
FIG. 3 is a front view of FIG 1.
Figure 4:
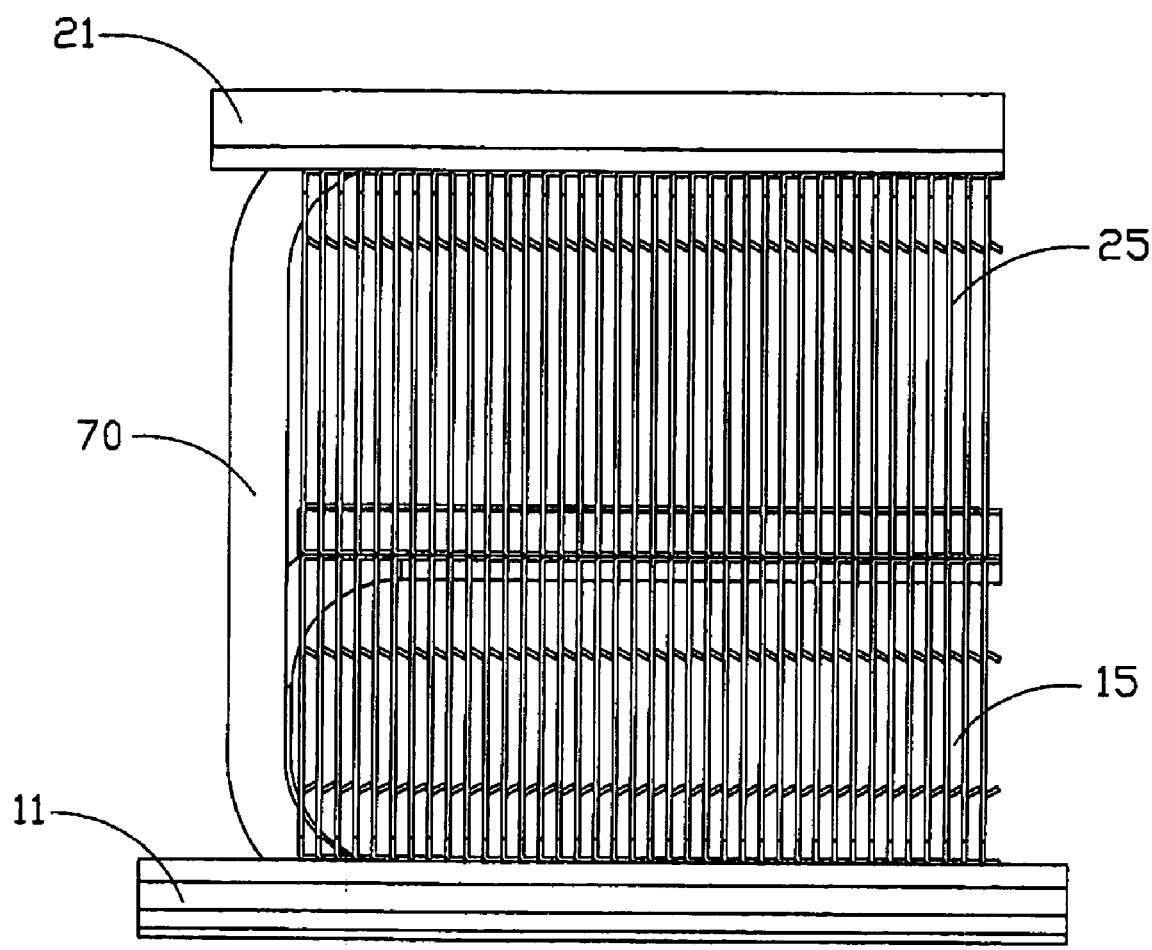
FIG. 4 is a side view of FIG. 1.

Reference will now be made to the drawing figures to describe the present invention in detail.

FIG. 1 to FIG. 4 show a heat dissipating device in accordance with the preferred embodiment of the present invention, for removing heat from computer electronic devices such as CPUs (not shown). The heat dissipating device comprises a heat sink 10, a first heat pipe 50 and a second heat pipe 70.

The heat sink 10 has a first base 11, a second base 21 and a plurality of spaced fins disposed between the two bases 11, 12. The fins include a first fin unit 15 and a second fin unit 25 disposed on the first fin unit 15. The first base 11 has a top surface and a bottom surface opposite to the top surface. The bottom surface of the first base 11 is for contacting with the CPU for heat-absorption. A pair of parallel grooves is defined in the top surface of the first base 11, and correspondingly, the first fin unit 15 defines a pair of parallel grooves at a bottom portion thereof. Thus when the first fin unit 15 is attached to the first base 11, two holes 12, 13 for receiving the first heat pipe 50 and the second heat pipe 70 are formed between the first fin unit 15 and the first base 11 by the grooves thereof.

The first heat pipe 50 and the second heat pipe 70 are U-shaped. The first heat pipe 50 has a heat-absorption end 51 and a heat-dissipation end 52 parallel to the heat-absorption end 51. The second heat pipe 70 has a heat-absorption end 71 and a heat-dissipation end 72 parallel to the heat-absorption end 71.

A block 40 is disposed between the first fin unit 15 and the second fin unit 25. The block 40 has a trapezoid cross-section. A bottom of the second fin unit 25 defines a trapezoid groove to receive the block 40 therein. A bottom of the block 40 and a top of the first fin unit 15 define a groove respectively and correspondingly, to jointly form a hole 17 for receiving the heat-dissipating end 52 of the first heat pipe 50. A bottom of the second base 21 and a top of the second fin unit 25 form a groove respectively and correspondingly, to jointly form a hole 23 for receiving the heat-dissipating end 72 of the second heat pipe 70. Preferably, the first base 11, the second base 21, the first fin unit 15 and the second fin unit 25 are manufactured independently. In assembly, they are welded together.

Alternatively, the heat-absorption ends 51, 71 of the heat pipes 50, 70 can be inserted into the first base 11 completely, instead of being received in the holes 12, 13 formed between the first base 11 and the first fin unit 15. Similarly, the heat-dissipation ends 52, 72 of the heat pipes 50, 70 can be completely inserted into the block 40 and the second base 21 respectively.

Figure 5:
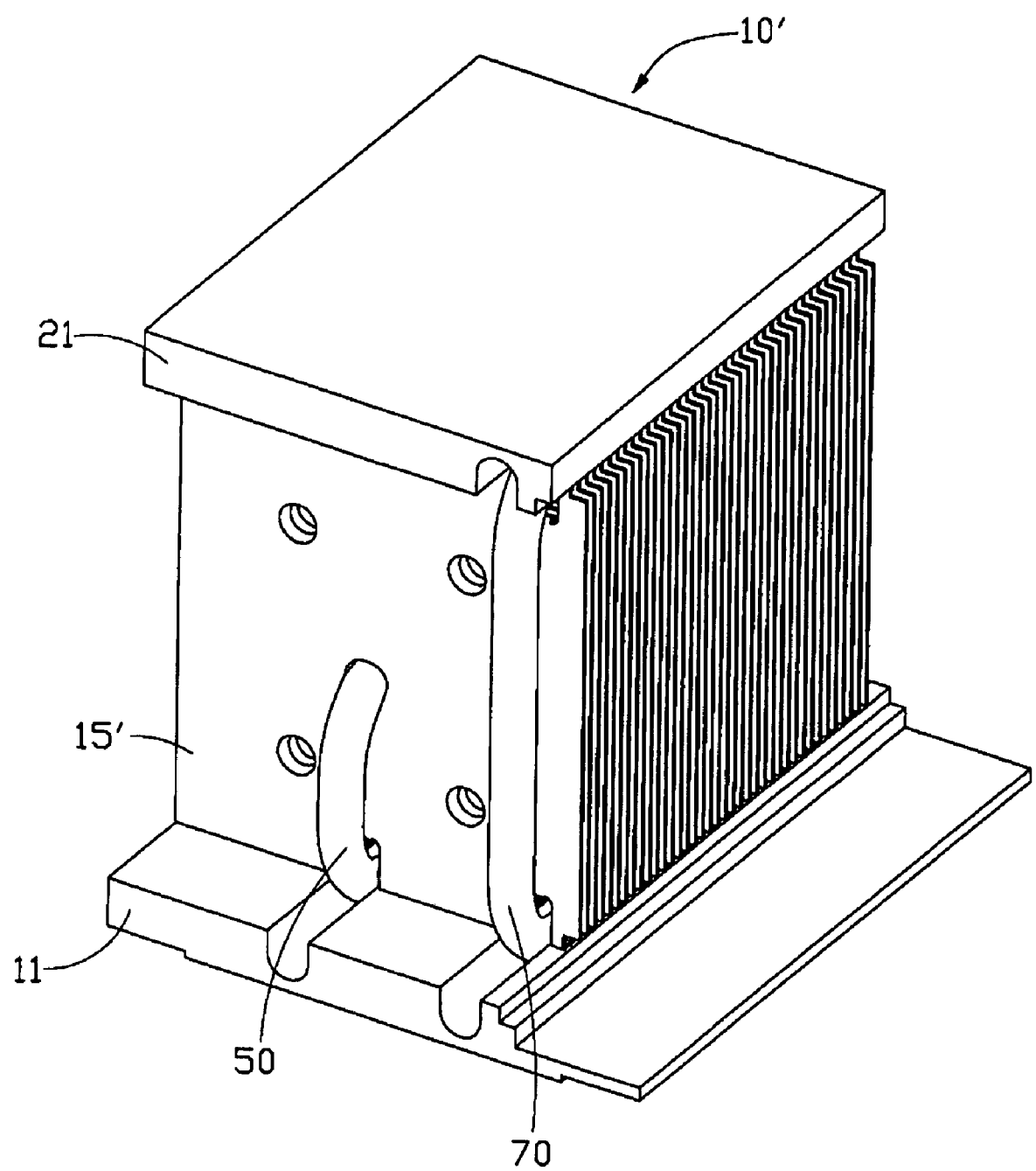
FIG. 5 is an assembled view of a heat dissipating device in accordance with another preferred embodiment of the present invention.

FIG. 5 shows a heat dissipating device in accordance with an alternative preferred embodiment of the present invention. The heat dissipating device in FIG. 5 is similar to the heat dissipating device disclosed in FIG. 1 except for fins 15'. The fins 15' consists of a fin unit and are located between the first base 11 and the second base 21. The heat-dissipation end 51 of the first heat pipe 50 is directly inserted in a middle of the fins 15'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating device for dissipating heat from a heat-generating component, comprising:
    a heat sink comprising a first base and a plurality of fins extending from the first base; and
    first and second heat pipes each comprising a heat-absorption end and a heat-dissipation end, the heat-absorption end of each of the heat pipes contacting the first base of the heat sink, the heat-dissipation end of the first heat pipe inserted in a substantial middle portion of the fins and the heat-dissipation end of the second heat pipe inserted in a top portion of the heat sink.

2. The heat dissipating device of claim 1, further comprising a second base disposed on a top of the fins.

3. The heat dissipating device of claim 1, wherein the first base of the heat sink and a bottom of the fins define two grooves respectively and correspondingly to cooperatively receive the heat-absorption ends of the two heat pipes therein.

4. The heat dissipating device of claim 2, wherein the second base and the top of the fins define a groove respectively and correspondingly to cooperatively receive the heat-dissipating end of the second heat pipe therein.

5. The heat dissipating device of claim 2, wherein the fins comprise a first fin unit and a second fin unit.

6. The heat dissipating device of claim 5, wherein the first and second bases are substantially parallel to each other and are welded to the first and second fin unit respectively.

7. The heat dissipating device of claim 5, wherein a block is disposed between the first fin unit and the second fin unit.

8. The heat dissipating device of claim 7, wherein the block has a trapezoid cross-section, and a bottom of the second fin unit forms a groove to receive the block therein.

9. The heat dissipating device of claim 7, wherein the block and a top of the first fin unit define a groove respectively and correspondingly to cooperatively receive the heat-dissipating end of the first heat pipe therein.

10. The heat dissipating device of claim 1, wherein the first heat pipe and the second heat pipe both are U-shaped.

11. A heat dissipation device for dissipating heat from a heat-generating component, comprising:
    a heat sink comprising a first base and a plurality of fins extending from the base; and
    first and second heat pipes each comprising a heat-absorption end and a heat-dissipation end, the heat-absorption end of each of the heat pipes contacting the first base of the heat sink, the heat-dissipation ends of the first and second heat pipes inserted in the heat sink at two different positions above the first base with a distance existed between the two positions in a direction in which the fins extend from the first base.

12. The heat dissipation device of claim 11, further comprising a second base disposed on a top of the fins.

13. The heat dissipation device of claim 12, wherein the first base and a bottom of the fins define two grooves respectively and correspondingly to cooperatively receive the heat-absorption ends of the two heat pipes therein.

14. The heat dissipation device of claim 12, wherein the second base and the top of the fins define a groove respectively and correspondingly to cooperatively receive the heat-dissipating end of the second heat pipe therein.

15. The heat dissipation device of claim 14, wherein the heat-dissipation end of the first heat pipe is inserted in a substantial middle portion of the heat sink.

16. The heat dissipation device of claim 15, wherein the fins comprise first and second fin units with one stacked on the other.

17. The heat dissipation device of claim 16, further comprising a block arranged between the first and second fin units, the heat-dissipation end of the first heat pipe contacting the block.

18. A heat dissipation device comprising:
    a bottom base adapted to contact a heat generating device;
    an upper base upward spaced from the bottom base in a parallel relation;
    a first set of parallel spaced fins upwardly extending from an upper face of the bottom base;
    a second set of parallel spaced fins downwardly extending from a lower face of the upper base;
    a middle base positioned between the upper base and the bottom base and engaged with both said first set of parallel spaced fins and said second setoff parallel spaced fins; and
    a first heat pipe connecting said bottom base to the upper base, and a second heat pipe connecting said bottom base and the middle base.

19. The heat dissipation device of claim 18, wherein the first set of parallel spaced fins are equipped with upper flanges, and the second set of parallel spaced fins are equipped with lower flanges mechanically and thermally contacting said upper flanges.

* * * * *